US006881096B2

(12) United States Patent
Brown et al.

(10) Patent No.: US 6,881,096 B2
(45) Date of Patent: Apr. 19, 2005

(54) COMPACT SERIAL-TO-ETHERNET CONVERSION PORT

(75) Inventors: Curtis D. Brown, Dove Canyon, CA (US); Charles J. Brower, Irvine, CA (US)

(73) Assignee: Lantronix, Inc., Irvine, CA (US)

( * ) Notice: Subject to any disclaimer, the term of this patent is extended or adjusted under 35 U.S.C. 154(b) by 0 days.

(21) Appl. No.: 10/122,867

(22) Filed: Apr. 15, 2002

(65) Prior Publication Data

US 2003/0194908 A1 Oct. 16, 2003

(51) Int. Cl.$^7$ .................. H01R 13/66; H01R 33/945; H01R 24/00
(52) U.S. Cl. ......................... 439/620; 439/676
(58) Field of Search ................. 439/676, 609, 439/620, 76.1

(56) References Cited

U.S. PATENT DOCUMENTS

| | | | |
|---|---|---|---|
| 4,603,320 A | 7/1986 | Farago | |
| 4,789,847 A | 12/1988 | Sakamoto et al. | 333/185 |
| 4,972,470 A | 11/1990 | Farago | |
| 4,978,317 A | 12/1990 | Pocrass | 439/490 |
| 5,015,204 A | 5/1991 | Sakamoto et al. | 439/620 |
| 5,069,641 A | 12/1991 | Sakamoto et al. | 439/620 |
| 5,139,442 A | 8/1992 | Sakamoto et al. | 439/620 |
| 5,282,759 A | 2/1994 | Sakamoto et al. | 439/620 |
| 5,587,884 A | * 12/1996 | Raman | 361/728 |
| 5,647,765 A | 7/1997 | Haas et al. | 439/609 |
| 5,647,767 A | * 7/1997 | Scheer et al. | 439/620 |
| 6,062,908 A | 5/2000 | Jones | |
| 6,203,334 B1 | * 3/2001 | Daoud et al. | 439/76.1 |
| 6,350,152 B1 | * 2/2002 | Belopolsky et al. | 439/541.5 |
| 6,381,283 B1 | 4/2002 | Bhardwaj et al. | 375/257 |
| 6,478,611 B1 | * 11/2002 | Hyland | 439/490 |
| 2002/0119702 A1 | * 8/2002 | Chen | 439/607 |

OTHER PUBLICATIONS (Internet Literature) Amphenol Canada Corp., "RJmag," Feb., 2000, 6 pgs., Canada.
(Internet Literature) Tyco Electronics, "Amp Gigabit Ethernet Multimode SFP MT–RJ Transceivers," Catalog 1308513, Oct. 10, 2000, pp. 1–11.

* cited by examiner

Primary Examiner—Chandrika Prasad
(74) Attorney, Agent, or Firm—Eric K. Satermo

(57) ABSTRACT

The present invention relates to a serial-to-ethernet modular converter jack and a method of fabricating of the same. The serial-to-ethernet converter electronic components, including the control software stored in on-board memory, are miniaturized and housed entirely in an RJ-45 jack. The present invention is constructed of a shielded housing that defines an open front portion for a connector port. The housing of the present invention also includes a segregated interior chamber, which encases all of the electrical components necessary to complete a serial-to-ethernet conversion of data. Lead pins electrically connected to the circuitry within the interior chamber, protrude from the based of the connector jack providing for a means to mate the jack to a circuit board. First, second and third circuit boards collectively incorporate the serial-to-ethernet circuitry components. Both the first circuit board incorporating magnetic circuitry and the second circuit board incorporating control circuitry are positioned in generally horizontal parallel relation within the interior chamber. The second circuit board which defines opposed sides includes electronic components disposed upon the upper and lower of both sides of said second circuit board. The third circuit board, incorporating connections to the LEDs, is positioned generally perpendicular in relation to the first and second circuit boards and is structurally connected to said first and second circuit boards, additionally providing an electrical connection between the first and second boards. Alternative embodiments of the invention are disclosed and include various arrangement of the serial-to-ethernet circuitry within the interior chamber of the housing.

44 Claims, 6 Drawing Sheets

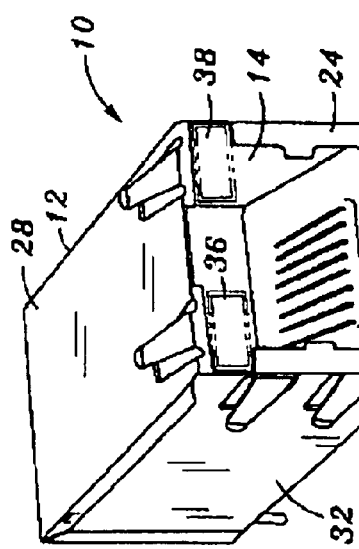
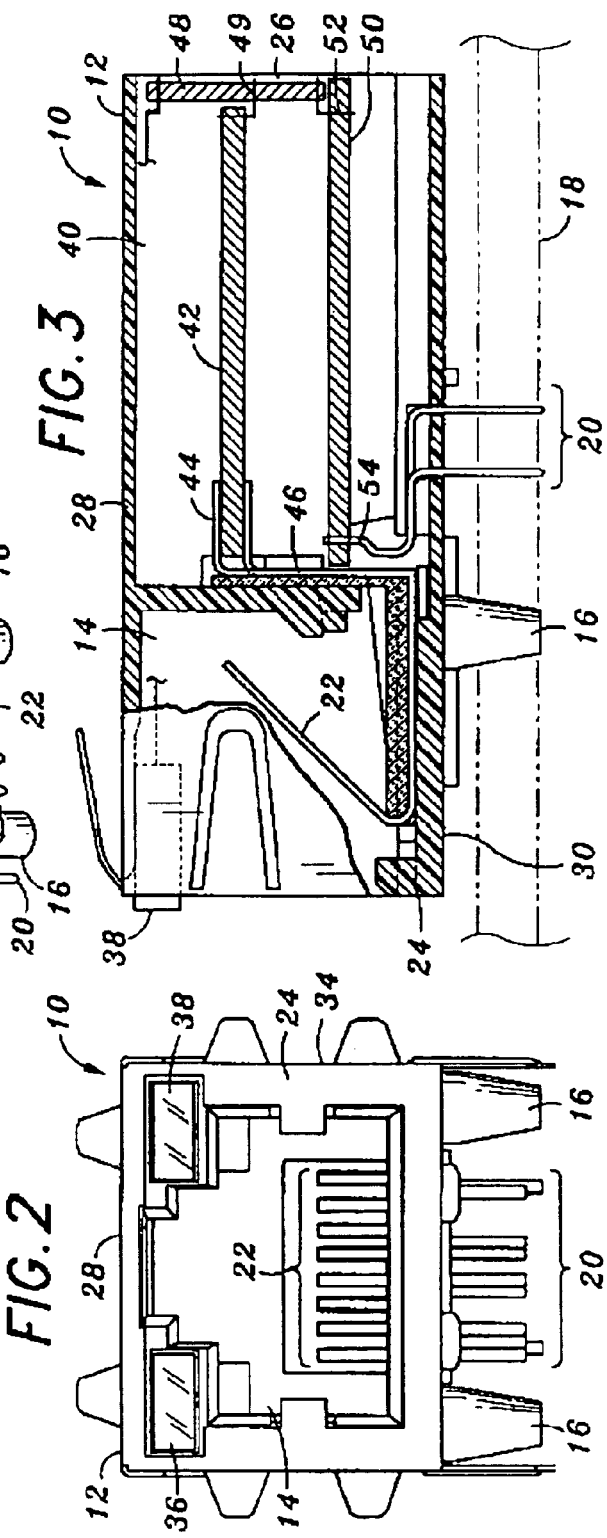

COMPACT SERIAL-TO-ETHERNET CONVERSION PORT

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates to generally to ethernet ports and the serial-to-ethernet conversion associated with such ports. More particularly, the invention relates to the structure and method of fabrication of a serial-to-ethernet converter housed completely within an ethernet jack to provide profile reduction, and reduce manufacturing cost and complexity. Furthermore, the serial-to-ethernet converter also contains general purpose programmable input/output pins (PIO). These PIOs can be used to control devices that have no microcontroller, and also read data from such devices. This integral RJ-45/converter device can thus be used as a complete modular ethernet interface for electronic devices that lack intelligence (no microcontroller).

A Registered Jack-45 (RJ-45) is a wire connector used commonly to interface microcontroller based products onto local area networks (LAN), particularly ethernets. RJ-45 connectors employ a male plug and a female jack or socket. The present invention concerns an improved RJ-45 ethernet Jack that integrates functionality which is commonly required for an interface to electronic devices.

The RJ-45 jack characteristically is comprised of a housing incorporating a planar array of parallel electrical contacts for mating with the RJ-45 plug and its aligned electrical contacts. The jack contacts are typically spring contacts for biased engagement with the plug.

Microcontroller based products commonly use serial communication, and it is common to encode the serial communication in an RS-232[EIA-232] format. It is therefore necessary to convert the serial protocol to ethernet signals to allow LAN access. This is typically accomplished through a serial-to-ethernet converter that takes the RS-232 encoded TTL data, and transparently translates the data to twisted-pair ethernet protocol signals [10/100 Base-T]. In the prior art, signal translation and conditioning, such as the serial-to-ethernet conversion, has been achieved through components mounted to a printed circuit board (PCB) adjacent to the RJ-45 jack or mounted on a PCB with the jack.

PCB components used in serial to ethernet conversion include electronics such as general purpose microcontrollers, media access controllers, ethernet physical layer devices (PHY), memory chips, voltage regulator chips, supervisory circuits, and various passive components (resistors, capacitors, inductors, and crystals). The PCB also typically includes adjacent status or diagnostic light emitting diodes (LEDs). In addition, the adjacent PCB typically includes components for electrical isolation, electrostatic discharge (ESD) protection, suppression of incoming interfering signals, and suppression of radiated and conducted interference. The components used for these purposes typically consist of magnetic isolation transformers and chokes, capacitors, and resistors. These are commonly referred to as the "magnetics".

In known devices, the numerous electronic components associated with a serial-to-ethernet conversion are connected to an RJ-45 connector jack through a series of printed or discrete wires or leads, either remotely or immediately adjacent the RJ-45 jack when the jack is mounted directly on the PCB board. Manufacturers have attempted to provide modular systems for ethernet-to-serial conversion, however, in all instances the electronic circuitry associated with the conversion is mounted to a PCB board outside of the RJ-45 jack housing. Because of the standard arrangement of the RJ-45 jack and attendant electronic circuitry components, known systems require a substantial footprint which takes up critical limited space.

Connector manufacturers have attempted to place signal conditioning components and LEDs inside the bodies of connectors. For example, isolation and filtering magnetics have been placed within jack housings that have been extended at the back of the connectors to accommodate a PCB and windings. Status LEDs have been mounted in the front of the RJ 45 jack, and controlled through extra leads protruding from the bottom of the connector. An example of integrated LED components may be found at U.S. Pat. No. 4,978,317, the substance of which is incorporated herein by reference. In known devices, manufacturers have failed to place all of the components necessary for a complete conversion from serial to ethernet within the standard jack housing. In this regard, manufacturers have failed to provide a modular RJ 45 jack with complete serial to ethernet conversion.

BRIEF SUMMARY OF THE INVENTION

The present invention relates to a serial-to-ethernet modular converter jack and a method of fabricating of the same. In the embodiments of the present invention serial-to-ethernet converter electronic components are miniaturized and housed entirely in an RJ-45 jack. All of the necessary components for conversion from serial-to-ethernet, including, but not limited to, controller hardware, magnetic hardware and firmware are included therewith. Controlling communication functions are integrated into an integrated circuit package and miniaturized peripheral chips, including memory, voltage regulators and supervisory circuits are included on one or more PCBs within the housing of a jack. The converter jack of present invention additionally includes enough on board memory, so that all necessary controlling firmware is contained within the converter. Provision is also made for adding control and monitoring functions, as well as ethernet connectivity, to non intelligent devices [which can't work with RS 232 serial data], through the addition of PIO pins. Other communication interfaces can also be added with slight modifications because of the capability of the integrated microcontroller [such as, but not limited to, inter-IC control (I2C), serial peripheral interface (SPI), controller area network (CAN), ProfiBus, universal serial bus (USB), and Dual Port Memory]. This means that the module can act as a converter between ethernet and many other interfaces.

The device of the present invention allows for adding ethernet connectivity to a new product in a simple and cost-effective manner. The device of the present invention contains all required hardware and firmware for effective serial-to-ethernet conversion and requires very few connections between a product's printed circuit board (typically 10 or less) and requires no more space than a typical RJ-45 jack.

The serial-to-ethernet converter jack of the present invention is constructed of a shielded housing that defines an open front portion for a connector port. The connector port includes a plurality of electrical contacts positioned within an open cavity of the housing to mate with a plug counterpart. The housing of the present invention also includes a segregated interior chamber, which encases all of the electrical components necessary to complete a serial-to-ethernet conversion of data. First, second and third circuit boards, in common electrical communication with the electrical contacts of the connector port, collectively incorporate the serial-to-ethernet circuitry components. The first and second circuit boards are positioned in generally horizontal parallel relation within the interior chamber. The third circuit board is positioned generally perpendicular in relation to the first and second circuit boards and is structurally connected to said first and second circuit boards, additionally providing structural support for said first and second circuit boards. The third circuit board additionally electrically connects said first and second circuit boards to each other.

The first circuit board includes magnetic isolation and filtering circuitry components. The second circuit board which defines opposed sides, includes controller circuitry components which are disposed upon the upper and lower of both sides of said second circuit board. The third circuit board connects the other circuit boards and the LEDs together.

The present invention additionally includes a method of forming an integrated serial-to-ethernet converter jack. The method for creating the conversion jack includes the following steps: providing a housing having an open cavity in segregated interior chambers; positioning an array of electrical contacts within the open cavity to form a connector port; positioning a first and second circuit board within the interior of chamber wherein said circuit boards are positioned in generally horizontal parallel relation; and positioning a third circuit board in generally perpendicular relation to the first and second circuit boards to electrically connect and structurally support said first and second circuit boards.

Alternative embodiments of the invention are additionally disclosed and include varying ways to position the serial-to-ethernet circuitry within the interior chamber of the housing. A first alternative embodiment discloses two circuit boards, the first being positioned generally horizontal within the interior chamber and the second being positioned at an angle relative to the first circuit board. A third embodiment of the present invention discloses a plurality of circuit board formed on a flexible substrate wherein the flexible substrate is bent to fit within the interior chamber. A fourth embodiment discloses an apparatus and method for forming the connector jack of the present invention wherein a first circuit board is positioned vertically within the interior chamber and a second circuit board is positioned at an angle relative to the first circuit board within the interior chamber of the housing. A fifth embodiment of the present invention provides an interior chamber which is positioned below the connector port, and the serial-to-ethernet circuitry may be positioned within the interior chamber. In the preferred embodiment and in all of the alternatives embodiments, lead pins electrically connected to the circuitry within the interior chamber, protrude from the based of the connector jack providing for a means to mate the jack to a circuit board.

It should be noted and understood that with respect to the embodiments of the present invention, the materials suggested may be modified or substituted to achieve the general overall resultant high efficiency. The substitution of materials or dimensions remain within the spirit and scope of the present invention.

BRIEF DESCRIPTION OF THE DRAWINGS

These as well as other features of the present invention will become more apparent upon reference to the drawings wherein:

FIG. 1 is a front perspective view of the ethernet connector of the present invention;

FIG. 2 is a front view of the ethernet connector of the present invention;

FIG. 3 is a side, partially cut-away view of the ethernet connector of the present invention;

DETAILED DESCRIPTION OF THE INVENTION

Figure 4:
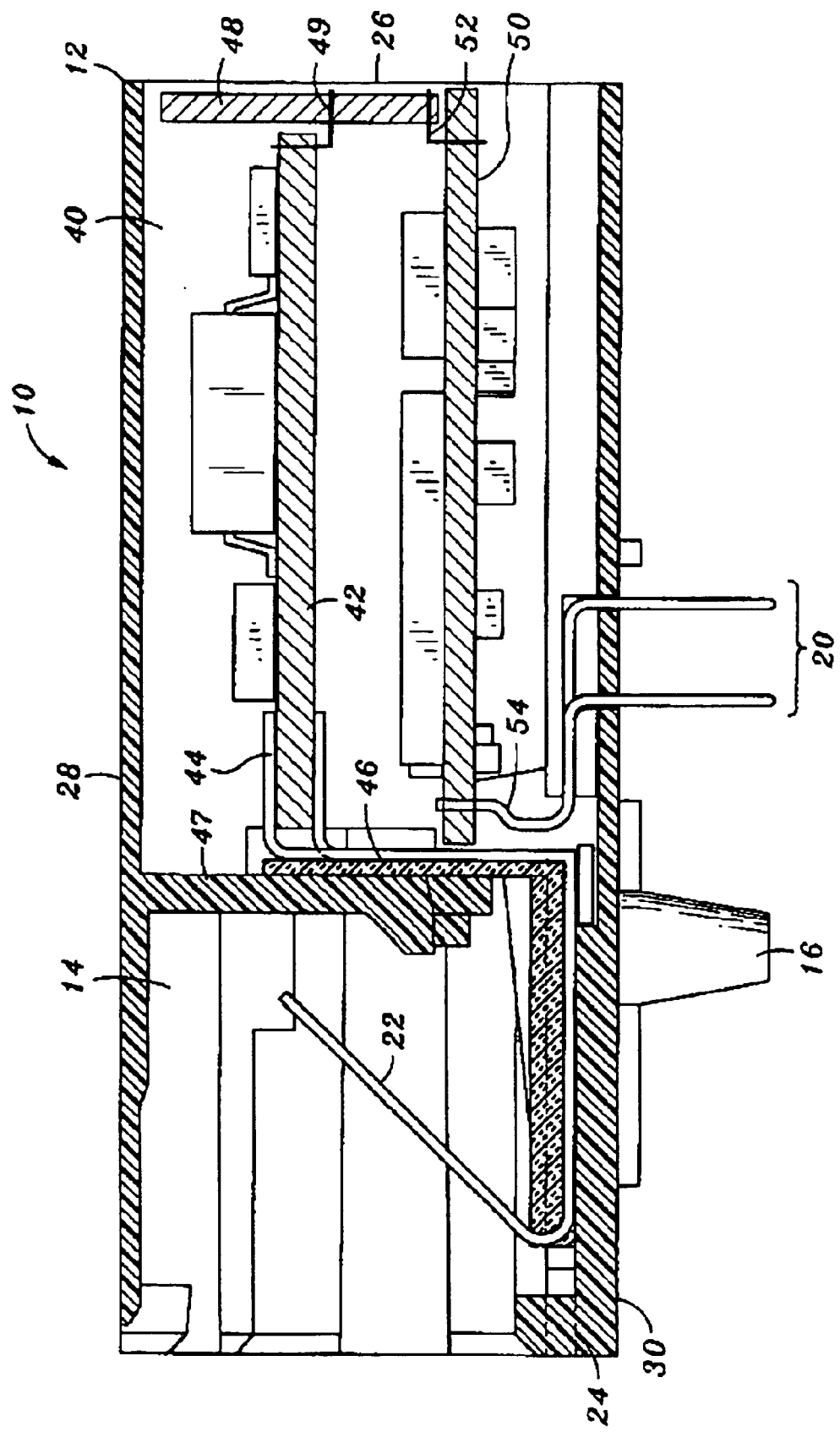
FIG. 4 is a side cross-sectional view of the ethernet connection of the present invention.

The detailed description as set forth below in connection with the appended drawings is intended as a description of the presently preferred embodiments of the present invention, and does not represent the only embodiment of the present invention. It is understood that various modifications to the invention may be comprised by different embodiments and are also encompassed within the spirit and scope of the present invention.

Referring particularly to FIGS. 1, 2 and 3, FIG. 1 shows a perspective front view of the ethernet connector 10 of the present invention. FIG. 2 shows a front view of the connector 10 of the present invention. FIG. 3 shows a cut-away side view of the connector 10. Connector 10 comprises a generally rectangular housing 12. The front of the housing includes an open cavity 14. A metal Faraday shield covers the top, sides and back of the housing and provides for electromagnetic-radiation (EMR) protection. The connector 10 additionally includes spring biased grounding tabs 16 that connect the Faraday shield to chassis (earth) ground by contacting the enclosure in which the connector is mounted. Also shown, are an array of leads 20 for electrically interconnecting the connector 10 to a PCB 18.

The cavity 14 of the housing 12 incorporates a planar array of parallel electrical contacts 22 to provide the necessary electrical contacts to form a connector port within the cavity 14. The cavity 14 is sized and dimensioned and the contacts 22 are placed within the cavity to compliment a mating plug (not shown). The sized cavity 14 along with the contacts 22 form a standard RJ-45 connector jack. The jack contacts 22 are spring biased for engagement with a mating plug (not shown).

The housing 12 is formed of molded plastic or other suitable material used in the art, covered by a Faraday shield having a front wall 24, a rear wall 26, a top wall 28, a bottom wall 30 and sidewalls 32 and 34. The references herein of "top", "bottom", and "sides" are made for ease of explanation of the invention and should not be interpreted as limiting in any way. It is contemplated that the connector 10 may be oriented in a multitude of ways on a product.

The front wall 24 includes LEDs 36 and 38. The LEDs provide visual status and fault information for various functions of the serial-to-ethernet conversion, such as (but not limited to) ethernet connection speed, link present/absent, full/half duplex, ethernet activity, serial port activity, and microcontroller error conditions.

Referring particularly to FIGS. 3 and 4, the housing 12 includes a segregated interior chamber 40. As shown in FIG. 4, elements 46 and 47 separate the interior chamber 40 from the cavity 14. A first PCB 42 is disposed within the interior chamber 40 generally horizontal and parallel relative to the bottom wall 30. The first PCB 42 is soldered (or otherwise electrically connected) to the contact interface 44, which are mounted in a plastic insert. The completed insert assembly slides and snaps into the main housing 12. The contact interface pins 44 are formed such that their ends become the wiper contacts 22. Thus, the first PCB 42 is electrically interconnected to the contacts 22 of the port cavity 14. The contact interface 44 additionally provides structural support to the first PCB 42.

A second PCB 50 is also placed within the interior chamber 40, positioned generally horizontal and in general parallel relation to the bottom wall 30. The third PCB 50 is soldered (or otherwise electrically connected) to the array of leads 54, which are formed such that their ends become the input/output pins 20 (more specifically, these pins 20 connect power and ground, reset, serial data input and output, handshake and flow control lines, and PIO lines) that connect to the user's PCB 18. The array of leads 54 are mounted in a plastic insert. After the third PCB 50 is soldered (or otherwise connected) to the leads 54, the completed insert assembly slides and snaps into the main housing 12.

A third PCB 48 is placed within the interior chamber 40 generally vertically, and in general perpendicular relation to the other PCBs 42 and 50. PCB 48 is positioned adjacent the rear wall 26 and is structurally and electrically interconnected to the other PCBs 42 and 50 by the formed pins 49 and 52. PCB 48 and formed pins 49 and 52 thus provide the electrical connection between PCBs 42 and 50. The LEDs 38 have leads (not shown) that run close to the top of the enclosure 12, and these leads also connect to holes in PCB 48. This provides the electrical connection between the LEDs 38 and the control PCB 50.

The first, 42, and second PCB 50 collectively incorporate the electronic circuitry component necessary to complete a serial-to-ethernet conversion of data. PCB 42 includes the magnetics portion of the circuitry which includes, but is not limited, to isolation transformers, common mode chokes, termination resistors, and a high voltage discharge capacitor (for ESD and voltage surges). In this implementation, PCB 48 is used solely for electrical interconnection, but it could, also be used for circuitry components if required.

PCB 50 incorporates all of the electronic circuitry components necessary for the control function of the serial-to-ethernet conversion. The electronic components on board PCB 50 include, but are not limited to, a microprocessor and an ethernet controller (combined in an ASIC for the present invention), nonvolatile memory (flash memory in the present invention), voltage regulator, voltage supervisory circuit, crystals, resistors, capacitors, and ferrite beads (surface mount beads in the present invention).

In operation, the complete assembly is mounted on a PCB that is a part of some device or equipment. Serial data and general purpose PIO data flows from the device through the array of leads 20 and is processed by the circuitry collectively incorporated onto PCBs 42, 48 and 50. PCB 42 is interconnected to the contacts 22 which mate with a plug (not shown) to effectively transmit ethernet data thereto. Ethernet data can also flow from the ethernet port through wiper contacts 22, be processed by the circuitry collectively incorporated onto PCBs 42, 48 and 50, and flow out as serial data and general purpose PIO data through lead pins 20 into the external device. It is additionally contemplated by the present invention that the control circuitry, magnetic circuitry and LED circuitry may be interchanged among PCBs 42, 48 and 50 and that component may be positioned on one or both sides of each PCB's 42, 48 and 50.

Figure 5:
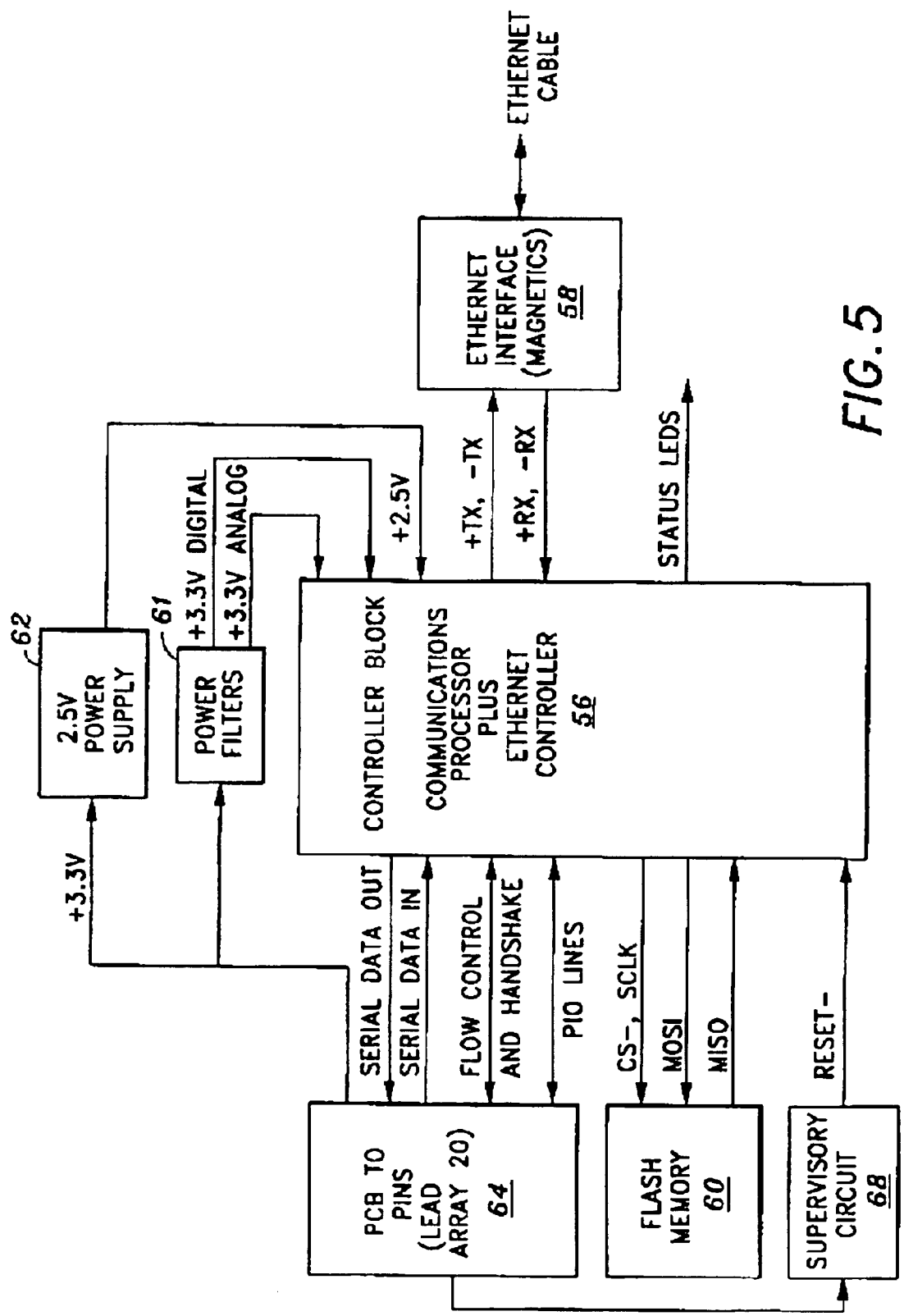
FIG. 5 is a block diagram of the electrical component circuitry for the serial-to-ethernet conversion for the ethernet connector of the present invention.

Referring particularly to FIG. 5 there is shown a block diagram of the controller components of PCB 50. The controller block 56 handles all of the conversion between serial and ethernet. This includes processing of the digital (serial) and analog (ethernet) signals, as well as all of the required code protocol translations. The controller block 56 communicates with ethernet through the ethernet interface 58, which is described below in greater detail. The flash memory 66 stores the software that the controller block 56 uses to perform its functions. The supervisory circuit 68 monitors the supply voltage coming in through the PCB IO pins 20. It resets the controller block if the voltage drops too low, or if a signal from the PCB IO pins 20 requests a system reset. The power filters 61 remove noise from the input supply voltage, and also reduce any noise that might be transmitted from the serial-to-ethernet converter to the outside world through the voltage supply lines. The 2.5V power supply 62 supplies a second supply voltage that is required by the controller block in the present invention. Serial data is transmitted to and from the controller block through the PCB IO pins 20 to the external device. The flow control and handshake lines (connected through PCB IO pins 20) are standard signals used to control the serial data stream. The controller block can also communicate with the external device through the PIO lines connecting through the PCB IO pins 20. It is understood that although the components as shown in FIG. 5 are specifically identified, it is contemplated by the present invention that any control circuitry that complete the control of function of serial-to-ethernet conversion is contemplated by the present invention.

Figure 6:
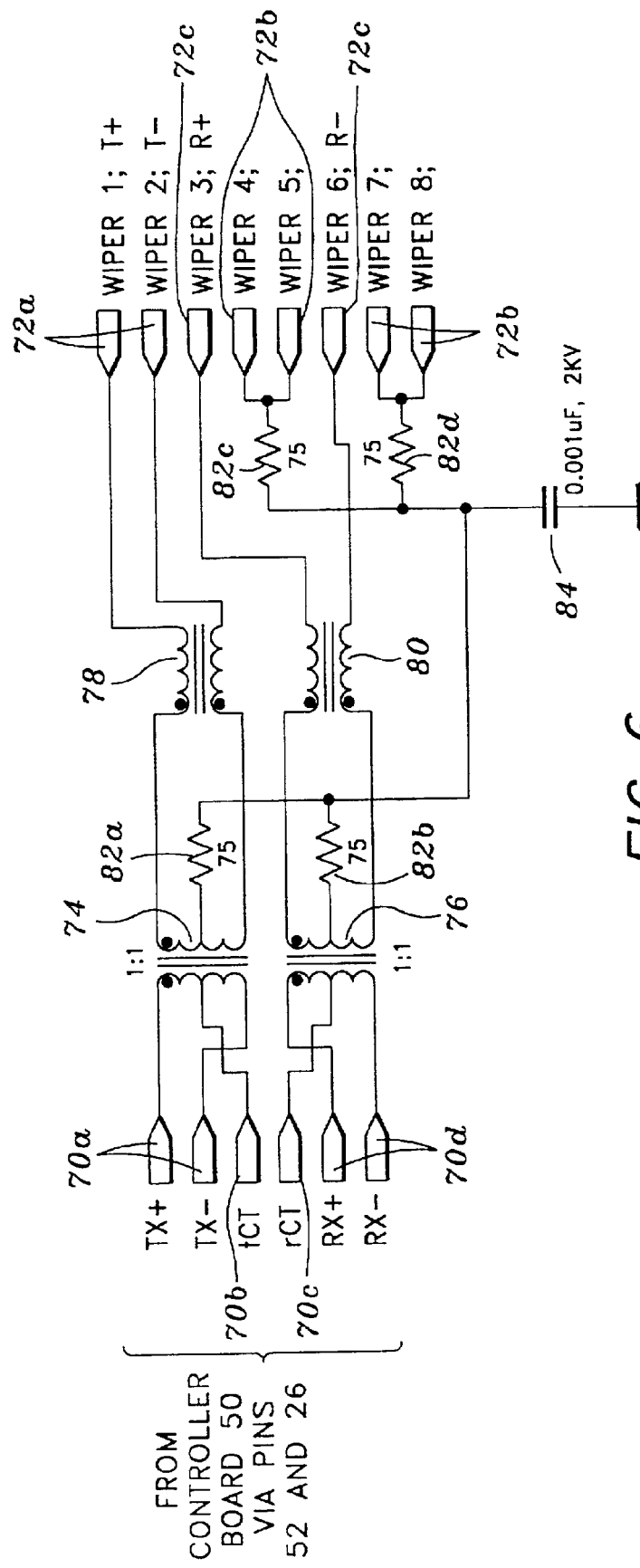
FIG. 6 is a pin input and output diagram for the ethernet connector of the present invention.

Referring particularly to FIG. 6 there is shown a schematic of the magnetic components incorporated into PCB 42. The outgoing ethernet signal 70a from the controller 50 passes through the isolation transformer 74, which eliminates any DC coupling problems between ethernet devices. The outgoing signals pass through the common mode choke 78, which reduces spurious emissions (radiated and conducted). The outgoing signal connects to the ethernet cable through contacts 72a of the RJ-45 jack. Incoming ethernet signals enter into the jack through contacts 72c, and pass through a common mode choke 80 which reduces spurious common mode noise that could be conducted into the device. The signals pass through the isolation transformer 76, and then to the controller board 50 through pins 52 and 26. The center taps 70b and 70c of the isolation transformers 74 and 76 are used to set the appropriate DC bias levels in the transmit and receive circuitry on the controller board 50. These center taps also connect to the controller board 50 through pins 52 and 26. Four of the RJ-45 contacts 72c are not used for ethernet signals. They are terminated to ground, through matching resistors 82c and 82d and capacitor 84, to reduce noise and DC transients. DC transients ("ESD") on the ethernet cable that are present at the contact 72a and 72c are reduced by discharge to ground through resistors 82a and 82b.

It is understood and contemplated by the present invention that any configuration of like components which would complete the magnetic portion of the overall serial-to-ethernet data conversion is contemplated by the present invention. For purposes of this disclosure, the term magnetics includes the components as described in FIG. 6.

Figure 7:
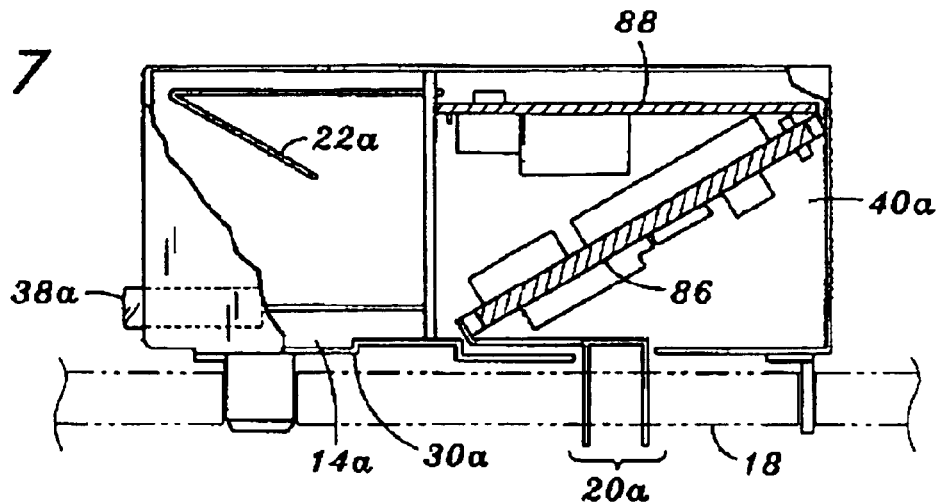
FIG. 7 is a side, partially cut-away view of an alternative embodiment of the present invention showing a horizontal circuit board in combination with an angled circuit board positioned within the interior chamber of the housing.

Referring specifically to FIG. 7, there is shown an alternate embodiment of the present invention. The alternate embodiment connector as shown in FIG. 7 is structurally similar to the embodiment shown in FIGS. 1-4, with only the distinctions highlighted below. Within the interior chamber 40a, two PCBs 86 and 88 are positioned therein. A first PCB 88 is positioned generally horizontal in parallel relation to the bottom wall 30a. A second PCB 86 is positioned in angular relation to the PCB 88 to fit within the interior chamber 40a. PCB 86 and 88 collectively incorporate the electric circuitry components to complete a serial to ethernet data conversion. PCB 86 is interconnected to a lead array 20a. PCB 86 includes all of the control circuitry, with components interconnected to the top side and bottom side of said PCB. PCB 86 is interconnected to PCB 88. PCB 88 includes the magnetic portion of the circuitry formed on the underside of PCB 86. The LEDs 38a and 36a (not shown) also connect to PCB 86 through leads 14a. PCB 88 is interconnected to contacts 22a.

Figure 8:
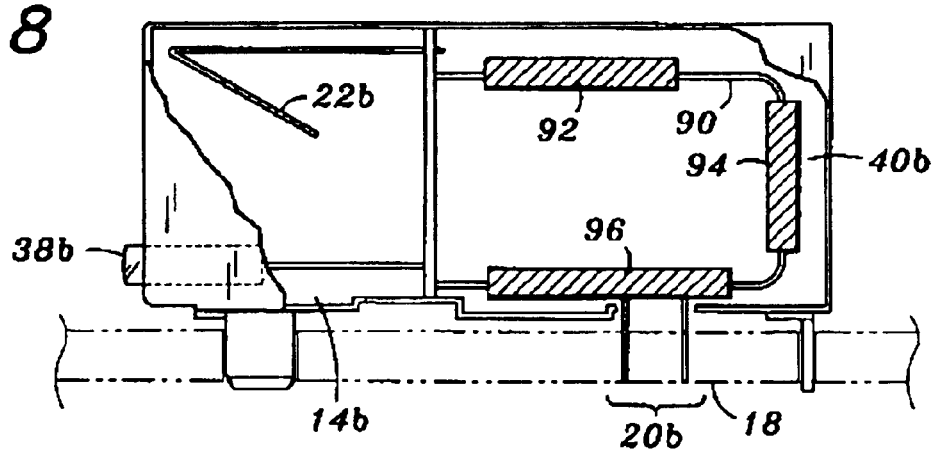
FIG. 8 is a side, partially cut-away view of an alternative embodiment of the present invention showing circuit boards placed on a common flexible substrate fitted with the interior chamber of the housing.

Referring specifically to FIG. 8 there is shown an alternative embodiment of the present invention. The alternate embodiment connector as shown in FIG. 8 is structurally similar to the embodiment as shown in FIGS. 14, with only the distinctions highlighted below. A common flexible substrate (more specifically, a rigid/flexible PCB 90, 92, 94, and 96) is formed to fit the interior chamber 40b. The rigid/flexible PCB 90, 92, 94, and 96 collectively incorporates the electric circuitry components to complete a serial to ethernet data conversion. Electrical and magnetic components can be mounted on the rigid portions of the PCB 92, 94, and 96. Electrical connections between the rigid portions 92, 94, and 96 are made on the flexible portions 90. Rigid portion 96 is electrically connected to the lead array 20b. Control circuitry may be incorporated onto rigid portion 96 and possibly 94, with magnetic circuitry incorporated on rigid portion 92 and possibly 94. The LEDs connect to rigid portion 96 through leads 14b. Rigid portion 92 is electrically connected to contacts 22. It is additionally contemplated that the control circuitry, magnetic circuitry and LED connections may be interchanged among rigid portions 92, 94 and 96.

Figure 9:
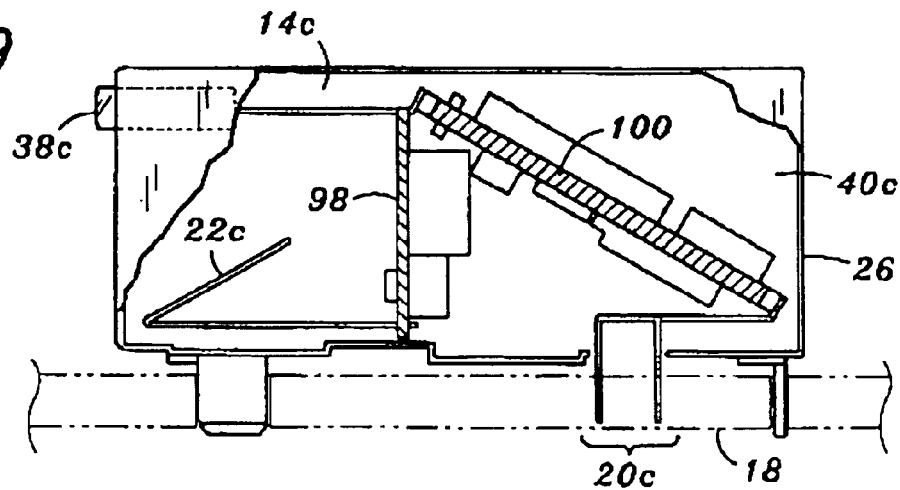
FIG. 9 is a side, partially cut-away view of an alternative embodiment of the present invention showing a vertically positioned circuit board and an angled circuit board positioned within the interior chamber of the housing.

Referring specifically to FIG. 9, there is shown an alternative embodiment to the present invention. The alternate embodiment connector as shown in FIG. 9 is structurally similar to the embodiment shown in FIGS. 1-4, with only the distinctions highlighted below. Within the interior chamber 40c, two PCBs 98 and 100 are positioned therein. The first PCB 98 is positioned generally vertically in parallel relation to the rear wall 26. A second PCB 100 is positioned in angular relation to the PCB 98 to fit within the interior chamber 40c. PCB 98 and 100 collectively incorporate the electric circuitry components to complete a serial-to-ethernet data conversion. PCB 100 is interconnected to a lead array 20c. PCB 100 includes all of the control circuitry with components interconnected to the top side and bottom side of said PCB. PCB 98 is interconnected to PCB 100. PCB 98 includes a magnetic portion of the circuitry. PCB 98 is interconnected to contacts 22c. PCB 100 is additionally interconnected to LEDs 38c and 36c.

Figure 10:
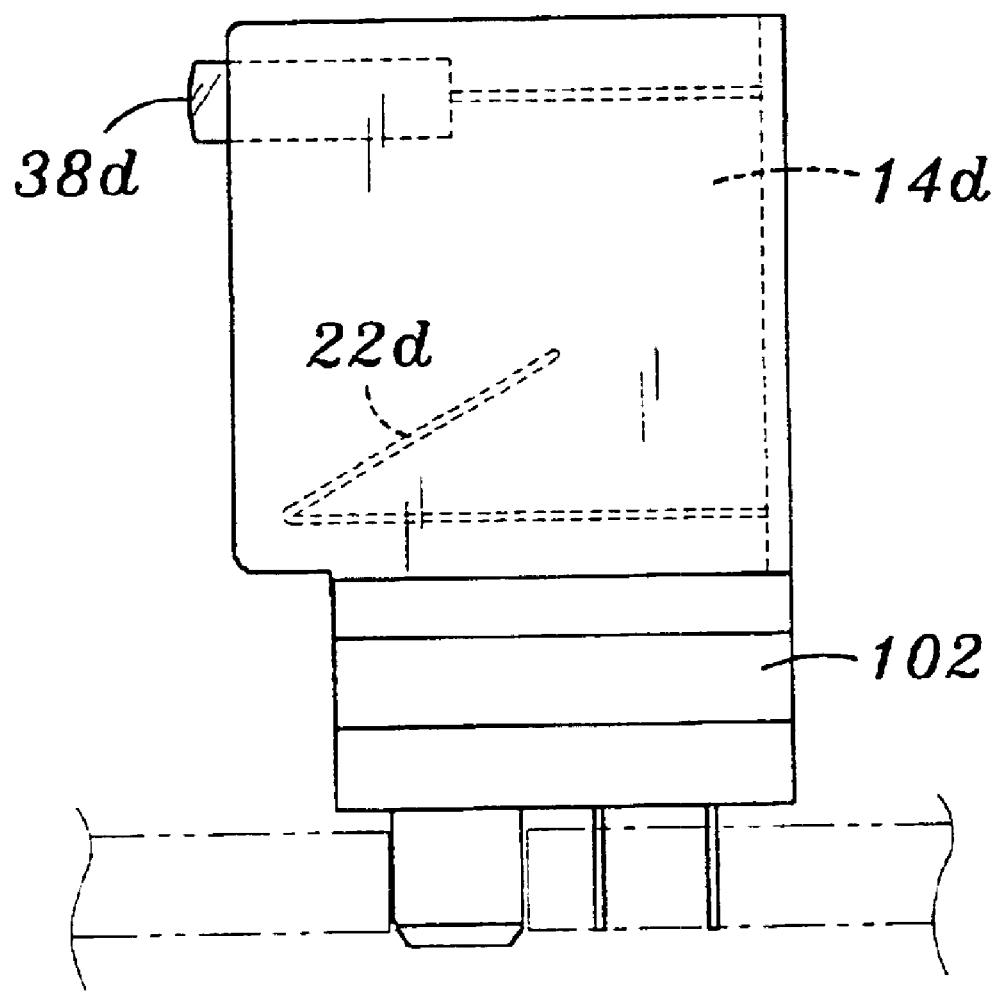
FIG. 10 is an alternative embodiment of the present invention showing the interior chamber located beneath the connector port.

Referring particularly to FIG. 10 there is shown an alternative embodiment to the present invention. The alternate embodiment connector as shown in FIG. 10 includes a connector port that is structurally similar to the embodiment shown in FIGS. 1-4, but which does not include an interior chamber located behind the port. In the alternate embodiment shown in FIG. 10, the interior chamber 102 is located beneath the port cavity 14d. Within the interior chamber 102, at least one PCB is positioned therein which incorporates the electric circuitry components to complete a serial-to-ethernet data conversion. It is contemplated by the present invention that the serial-to-ethernet circuitry may be incorporated into the interior chamber 102 in a variety of ways, including those described with respect to the interior chambers of FIGS. 4, 7–9.

Additional modifications to the method of the present invention and the devices used in accordance with the method will be apparent to those skilled in the art. It is understood that such additional modifications are within the scope and spirit of the present invention.

What is claimed is:

1. A modular communications jack comprising:
   a. a housing including an open cavity and an interior chamber, said open cavity and said interior chamber being segregated;
   b. a connector port having a plurality of electrical contacts positioned within said open cavity; and
   c. at least two circuit boards in common electrical communication positioned in spaced relation within said interior chamber and in electrical communication with said electrical contacts of said connector port, each of said circuit boards having opposed sides wherein electrical circuitry components are disposed on said circuit boards and on each of said opposed sides of at least one of said circuit boards.

2. The modular communications jack of claim 1 further comprising at least three said circuit boards disposed in common electrical communication and in spaced relation within said interior chamber, said circuit boards being in electrical communication with said electrical contacts of said connector port.

3. The modular communications jack of claim 2 wherein a first and a second circuit board of said at least three circuit boards are positioned in generally horizontal parallel relation and a third circuit board of said at least three circuit boards is positioned in generally perpendicular relation to said first and second circuit boards.

4. The modular communications jack of claim 3 wherein said third circuit board electrically connects said first and second circuit boards.

5. The modular communications jack of claim 3 wherein said third circuit board structurally supports said first and second circuit boards.

6. The modular communications jack of claim 1 wherein said circuit boards are each formed on a common flexible substrate.

7. A serial-to-ethernet converter jack comprising:
   a. a housing including an open cavity and an interior chamber, said open cavity and said interior chamber being segregated;
   b. a connector port having a plurality of electrical contacts positioned within said open cavity; and
   c. at least one circuit board disposed within said interior chamber in electrical communication with said electrical contacts of said connector port, said at least one circuit board including a controller block for performing serial-to-ethernet data conversion;

wherein said converter jack is a modular component which is capable of electrical connection to a circuit board or another electronic component.

8. The serial-to-ethernet converter jack of claim 7 wherein said at least one circuit board has first and second sides and said circuitry is disposed on both said first and second sides of said at least one circuit board.

9. The serial-to-ethernet converter jack of claim 7 wherein said circuit board further includes magnetics circuitry, controller circuitry, and LED circuitry.

10. The serial-to-ethernet converter jack of claim 9 further comprising at least three said circuit boards disposed in common electrical communication and in spaced relation within said interior chamber, said circuit boards being in electrical communication with being electrical contacts of said connector port.

11. The serial-to-ethernet converter jack of claim 10 further comprising at least one LED, wherein a first circuit board of said at least three circuit boards includes said magnetics circuitry, a second circuit board of said at least three circuit boards includes said controller circuitry, and a third circuit board of said at least three circuit boards connects said at least one LED to said controller circuitry.

12. The serial-to-ethernet converter jack of claim 11 wherein said second circuit board has first and second sides and said controller circuitry is disposed on both said first and second sides of said second circuit board.

13. The serial-to-ethernet jack of claim 7 wherein said housing has a height and a width that are substantially equal to the height and the width of a standard RJ-45 jack.

14. A method of forming an integrated communications jack comprising the steps of:
 a. providing a housing having an open cavity and an interior chamber that is segregated from said open cavity, said housing having a height and a width that are substantially equal to the height and the width of a standard RJ-45 jack;
 b. positioning an array of electrical contacts within said open cavity to form a standard RJ-45 connector port;
 c. positioning at least two circuit boards within said interior chamber, at least one of said circuit boards including a controller that is configured to convert Ethernet data to serial data; and
 d. electrically interconnecting said circuit boards to said electrical contacts of said connector port.

15. The method of forming a communications jack of claim 14 further comprising the step of positioning a first and a second circuit board of said at least two said circuit boards in generally parallel relation.

16. The method of forming a communications jack of claim 15 further comprising the step of positioning a third circuit board of said at least two circuit boards in generally perpendicular relation to said first and second circuit boards to electrically connect said first and second circuit boards.

17. The method of forming a communications jack of claim 15 further comprising the step of positioning a third circuit board of said at least two circuit boards in generally perpendicular relation to said first and second circuit boards to structurally support said first and second circuit boards.

18. The method of forming a communications jack of claim 14 further comprising the step of forming said circuit boards on a common flexible substrate.

19. A method of forming an integrated serial-to-ethernet converter jack comprising the steps of:
 a. providing a housing having an open cavity and an interior chamber that is segregated from said open cavity, said housing having a height and a width that are substantially equal to the height and the width of a standard RJ-45 jack;
 b. positioning an array of electrical contacts within said open cavity to form a standard RJ-45 connector port;
 c. positioning at least one circuit board within said interior chamber, said at least one circuit board including a controller block for performing serial-to-ethernet data conversion; and
 d. electrically interconnecting said circuit board to said electrical contacts of said connector port.

20. A communication module for connecting an electronic component to a cable, the cable having a plug and for carrying Ethernet data, the communication module comprising:
 a port for receiving the plug of the cable;
 an interface for connecting to the electronic component and for carrying serial data; and
 a circuit in communication with the port and the interface, the circuit comprising a controller for converting Ethernet data received at the port to serial data.

21. The communication module of claim 20 wherein the communication module is an RJ-45 jack.

22. The communication module of claim 20 wherein the port is configured to receive an RJ-45 plug.

23. The communication module of claim 20 further comprising a housing including an open cavity and an interior chamber;
 the open cavity and the interior chamber being segregated;
 the port being disposed in the open cavity; and
 the circuit being disposed in the interior chamber.

24. The communication module of claim 23 wherein the housing has a height and a width that are substantially equal to the height and the width of a standard RJ-45 jack.

25. The communication module of claim 20 wherein the controller also converts serial data received at the interface to Ethernet data.

26. The communication module of claim 20 wherein the circuit
 further comprises a flash memory connected to the controller for storing software for use by the controller for converting Ethernet data to serial data.

27. The communication module of claim 26 wherein the circuit further comprises a supervisory circuit connected to the interface and the controller for monitoring a supply voltage from the electronic component.

28. The communication module of claim 27 wherein the circuit further comprises a power filters connected to the interface and the controller for removing noise from the supply voltage.

29. The communication module of claim 28 wherein the circuit further comprises a power supply for supplying a second supply voltage to the controller.

30. The communication module of claim 20 wherein the interface comprises a plurality of input/output (I/O) pins.

31. The communication module of claim 30 wherein the plurality of I/O pins includes pins for transmitting serial data between the electronic component and the controller.

32. The communication module of claim 30 wherein the plurality of I/O pins includes pins for a flow-control line and a handshake line of the controller.

33. The communication module of claim 30 wherein the plurality of I/O pins includes programmable I/O (PIO) pins for enabling the controller to communicate with the electronic component.

34. The communication module of claim 26 wherein the circuit further comprises a magnetic circuit connected between the controller and the port.

35. The communication module of claim 20 further comprising at least one light emitting diode (LED) connected to the circuit.

36. The communication module of claim 20 wherein the electronic component is a printed circuit board (PCB), the interface comprising a plurality of I/O pins for connecting to the PCB.

37. The communication module of claim 36 further comprising:
- a Faraday shield; and
- a grounding tab for connecting the Faraday shield to the PCB.

38. The communication module of claim 20 further comprising:
- a housing including an open cavity in which the port is disposed and an interior chamber that is segregated from the open cavity; and
- a printed circuit board (PCB) disposed within the interior chamber, the circuit being disposed on the PCB.

39. In combination, a communication module and an electronic component, the communication module for connecting the electronic component to a cable, the cable having a plug and for carrying Ethernet data, the combination comprising:
- an electronic component that is incapable of converting Ethernet data to serial data;
- a communication module including:
- a port for receiving the plug of the cable;
- an interface connected to the electronic component and for carrying serial data; and
- a circuit in communication with the port and the interface, the circuit comprising a controller for converting Ethernet data received at the port to serial data and for providing the serial data to the interface.

40. The combination of claim 39 wherein the electronic component is a printed circuit board (PCB).

41. The combination of claim 39 wherein the communication module includes a housing that has dimensions substantially the same as a standard RJ-45 jack.

42. A method for forming a communication module for enabling an electronic component to be connected to an Ethernet cable, the electronic component being incapable of converting Ethernet data to serial data, the cable having a plug, the method comprising:
- providing a housing including:
    - a port for receiving the plug of the cable; and
    - an interface for connecting to the electronic component and for carrying serial data; and
- providing a circuit including a controller that is configured to convert Ethernet data to serial data; and
- connecting the circuit to the port and the interface.

43. A method for enabling an electronic component to be connected to an Ethernet cable, the electronic component being incapable of converting Ethernet data to serial data, the cable having a plug, the method comprising:
- providing a communication module including:
    - a port for receiving the plug of the cable;
    - an interface for carrying serial data; and
    - a circuit in communication with the port and the interface that is configured to convert Ethernet data received at the port to serial data and to provide the serial data to the interface; and
- connecting the interface to the electronic component.

44. A method for connecting an electronic component to an Ethernet cable, the cable having a plug, the method comprising:
- providing a combination including:
    - an electronic component that is incapable of converting Ethernet data to serial data;
    - a communication module including:
        - a port for receiving the plug of the cable;
        - an interface connected to the electronic component and for carrying serial data; and
        - a circuit in communication with the port and the interface, the circuit including a controller for converting Ethernet data received at the port to serial data and for providing the serial data to the interface; and
- connecting the plug of the cable to the port.

* * * * *